United States Patent
Kohno

(10) Patent No.: US 11,508,550 B2
(45) Date of Patent: Nov. 22, 2022

(54) METHOD AND APPARATUS FOR IMAGE PROCESSING

(71) Applicant: JEOL Ltd., Tokyo (JP)

(72) Inventor: Yuji Kohno, Tokyo (JP)

(73) Assignee: JEOL Ltd., Tokyo (JP)

(*) Notice: Subject to any disclaimer, the term of this patent is extended or adjusted under 35 U.S.C. 154(b) by 30 days.

(21) Appl. No.: 17/378,881

(22) Filed: Jul. 19, 2021

(65) Prior Publication Data

US 2022/0018923 A1  Jan. 20, 2022

(30) Foreign Application Priority Data

Jul. 20, 2020 (JP) .............................. JP2020-123566

(51) Int. Cl.
*H01J 37/28* (2006.01)

(52) U.S. Cl.
CPC ....... *H01J 37/28* (2013.01); *H01J 2237/2802* (2013.01)

(58) Field of Classification Search
CPC .. H01J 37/00; H01J 37/02; H01J 37/26; H01J 37/28; H01J 2237/2802; G01N 23/041; G01N 2223/03; G01N 2223/102; G01N 2223/418
USPC ......................................... 250/306, 307, 311
See application file for complete search history.

(56) References Cited

U.S. PATENT DOCUMENTS

| | | |
|---|---|---|
| 5,572,122 A | 11/1996 | Yajima et al. |
| 2012/0012747 A1* | 1/2012 | Lazar .................... H01J 37/244 250/311 |

FOREIGN PATENT DOCUMENTS

JP         6138196 A        5/1994

* cited by examiner

*Primary Examiner* — Jason L McCormack

(74) *Attorney, Agent, or Firm* — The Webb Law Firm

(57) ABSTRACT

There is provided an image processing method capable of generating an image representative of a magnetic field distribution. The method starts with acquiring phase images providing visualization of electromagnetic fields respectively in a plurality of columns. Then, each of the electromagnetic fields in the columns within the phase images is separated into magnetic field and electric field components. An image representative of a magnetic field distribution is created based on the separated magnetic field components. The step of separating each electromagnetic field includes separating the electromagnetic field in a first one of the columns into magnetic field and electric field components based on the electromagnetic field in a second one of the columns, the latter electromagnetic field having an electric field component oriented in the same direction as that in the first column.

10 Claims, 6 Drawing Sheets

K5

METHOD AND APPARATUS FOR IMAGE PROCESSING

CROSS-REFERENCE TO RELATED APPLICATION

This application claims priority to Japanese Patent Application No. 2020-123566 filed Jul. 20, 2020, the disclosure of which is hereby incorporated by reference in its entirety.

BACKGROUND OF THE INVENTION

1. Field of the Invention

The present invention relates to a method and apparatus for image processing.

2. Description of the Related Art

When an electron beam impinges on a sample, the beam may undergo phase variations from the sample. Techniques such as electron beam holography and differential phase-contrast (DPC) imaging make it possible to image or visualize such phase variations. However, in electron beam holography or DPC method, it is difficult to discern whether the phase variations are caused by electric fields produced by atomic nuclei within the sample or by magnetic fields emanating from electron spins or the like.

Especially, in the case of a high resolution image, electric fields produced by atomic nuclei are always observed to be strong. Therefore, in order to observe magnetic fields which are generated by electron spins and which are weaker than electric fields emanating from atomic nuclei, it is necessary to separate the electric and magnetic fields from each other.

In JP-A-6-138196, for example, there is disclosed an apparatus for measuring electromagnetic fields, the apparatus being provided with a mechanism for inverting the sample. The apparatus is designed to find an electric field distribution and a magnetic field distribution separately within a measured portion of a sample by measuring the direction and magnitude of deflection of an electron beam passing through the same measured portion of the sample before and after the inversion. This apparatus utilizes the fact that if the direction of impingement of the electron beam relative to the sample is reversed, the direction of the electric field induced force included in the Lorentz forces that the electron beam undergoes from the electromagnetic field does not vary but the direction of the magnetic field induced force is reversed.

With the electromagnetic field measuring apparatus set forth in JP-A-6-138196, the same portion of the sample must be measured before and after an inversion of the sample as mentioned above. However, it is difficult to measure exactly the same portion of a sample in atomic level, high resolution measurements before and after an inversion of the sample.

SUMMARY OF THE INVENTION

One aspect of the image processing method associated with the present invention comprises the steps of: acquiring phase images providing visualization of electromagnetic fields respectively in a plurality of columns; separating each of the electromagnetic fields in the columns within the phase images into magnetic field and electric field components; and generating an image representative of a magnetic field distribution based on the separated magnetic field components. The step of separating each of the electromagnetic fields in the columns includes the step of separating the electromagnetic field in a first one of the plurality of columns into magnetic field and electric field components based on the electromagnetic field in a second one of the columns, the electromagnetic field in the second column having an electric field component oriented in the same direction as that of the electromagnetic field in the first column.

In this method of image processing, each of the electromagnetic fields in the columns within the phase images can be separated into magnetic field and electric field components by image processing. Accordingly, this method of image processing enables one to obtain an image representative of a magnetic field distribution at atomic level, high resolution.

One aspect of the image processor associated with the present invention comprises:

a phase image acquisition portion for acquiring phase images providing visualization of electromagnetic fields respectively in a plurality of columns;

a field separating portion for separating each of the electromagnetic fields in the columns within the phase images into magnetic field and electric field components; and an image generating portion for generating an image representative of a magnetic field distribution based on the separated magnetic field components.

The image generating portion performs processing to separate the electromagnetic field in a first one of the plurality of columns into magnetic field and electric field components based on the electromagnetic field in a second one of the columns, the electromagnetic field in the second column having an electric field component oriented in the same direction as that of the electromagnetic field in the first column.

In this image processor, each one of the electromagnetic fields in the columns within the phase images can be separated into magnetic field and electric field components by image processing. Therefore, this image processor permits one to derive an image showing a magnetic field distribution at atomic level, high resolution.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Image Processing Method

An image processing method associated with one embodiment of the present invention is first described by referring to some figures. The image processing method associated with the present embodiment comprises the steps of: acquiring phase images providing visualization of electromagnetic fields respectively in a plurality of columns; separating each of the electromagnetic fields in the columns within the phase images into magnetic field and electric field components; and generating an image representative of a magnetic field distribution based on the separated magnetic field components. The step of separating each of the electromagnetic fields in the columns into magnetic field and electric field components includes the step of separating the electromagnetic field in a first one of the plurality of columns into magnetic field and electric field components based on the electromagnetic field in a second one of the columns, the electromagnetic field in the second column having an electric field component oriented in the same direction as that of the electromagnetic field in the first column.

1.1. Process Flow of Image Processing

Figure 1:
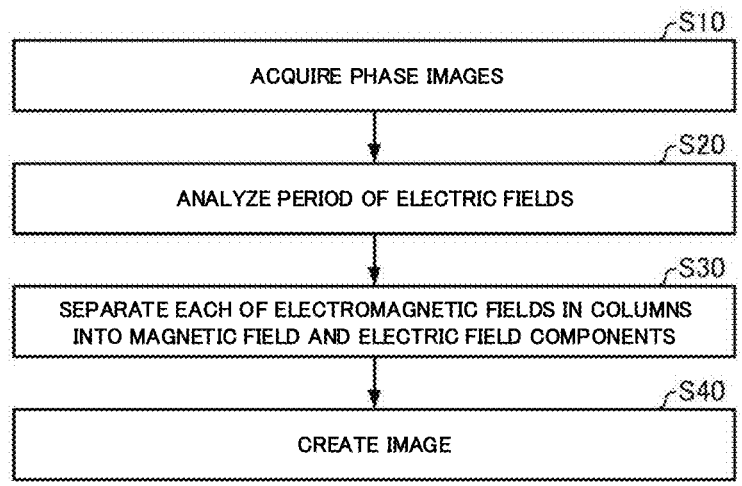
FIG. 1 is a flowchart illustrating one example of the image processing method associated with one embodiment of the present invention.

FIG. 1 is a flowchart illustrating one example of the image processing method associated with the present embodiment.
(1) Acquisition of Phase Image (S10)

A phase image of a field of view to be analyzed is first acquired. A phase image referred to herein is an image produced by visualizing phase variations in an electron beam caused by an electromagnetic field within a sample. Phase images include images produced by electron beam holography and images produced by differential phase-contrast (DPC) imaging.

Electron beam holography is a technique for reconstructing phase variations that electron waves undergo from a sample by utilizing the coherence of the electron waves. In particular, object waves are passed through the sample and undergo phase variations. Reference waves are produced from an electron source and passed through a vacuum and thus are not affected by the sample. These two types of waves are deflected by an electron biprism and made to interfere with each other, resulting in an electron hologram. The resulting hologram is then Fourier transformed. The principal interference components equally spaced from each other and making up the background of the Fourier transformed hologram are masked and removed. The modulated components (sidebands) of the diffracted waves transmitted through the sample are extracted and inverse Fourier transformed, thus reconstructing the phases at the bottom surface of the sample. Consequently, a phase image can be obtained.

The DPC imaging is a one type of STEM technique which measures, at each scan point, the deflection of an electron beam caused by the electromagnetic field within a sample and visualizes or images the electromagnetic field. In order to measure the deflection of the electron beam caused by the electromagnetic field in the sample, a segmented detector or a pixelated detector, for example, is used. In the case of the segmented detector, the amount (the distance traveled by the beam on the detector) and direction of the deflection of the electron beam within the sample can be detected by taking the difference between the amounts of signals from detector segments.

Note that phase images are not limited to those produced by electron beam holography or DPC imaging. Any image produced by visualizing phase variations of an electron beam caused by the electromagnetic field in a sample may be available as a phase image. For example, the phase image may be a ptychographic image.

Figure 2:
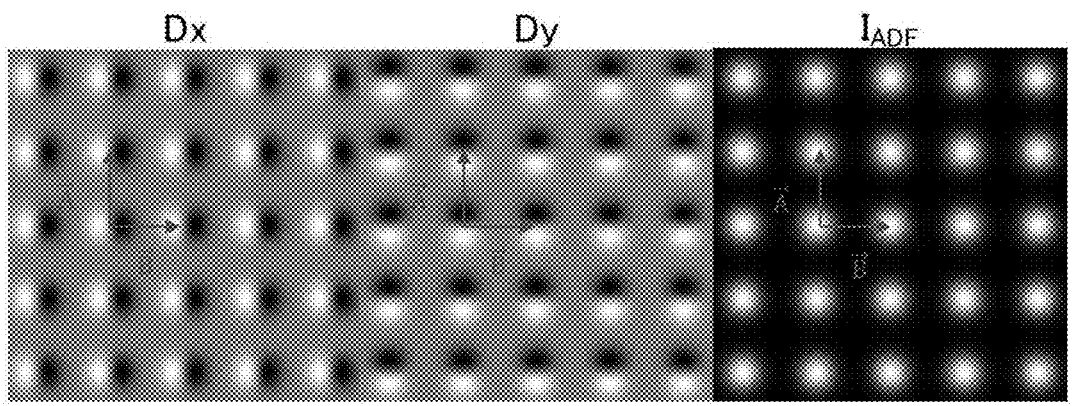
FIG. 2 is a schematic representation of phase images Dx and Dy and an annular dark field image $I_{ADF}$.

FIG. 2 schematically shows phase images (differential phase images) Dx and Dy of an electron beam derived by a DPC method and an annular dark field (ADF) image $I_{ADF}$ obtained at the same time. In FIG. 2, the phase images Dx and Dy indicate the amounts of deflections in the X direction and Y direction, respectively. In the phase images Dx and Dy, positive values are represented in white, while negative values are represented in black. The ADF image $I_{ADF}$ can be obtained by detecting electrons scattered by a sample by the use of an annular detector in a scanning transmission electron microscope.

The phase images Dx, Dy and the ADF image $I_{ADF}$ shown in FIG. 2 have been derived by observing an antiferromagnetic substance at atomic level, high resolution. In such an antiferromagnetic substance, the spins of adjacent atoms are oriented in mutually opposite directions and their magnetic fields cancel each other. Also, in an antiferromagnetic substance, electric fields emanating from individual atomic nuclei have substantially the same intensity and are oriented identically.

The images of FIG. 2 have been captured such that atoms whose spins are oriented in the same direction are aligned in the direction of the thickness of the sample of the antiferromagnetic substance. That is, the atomic columns in the images of FIG. 2 show the manner in which atoms having spins oriented in the same direction are aligned in the direction of the thickness of the sample. It can be confirmed from the images of FIG. 2 that there are columns arranged in the X and Y directions. Also, it is seen that the columns adjacent to each other in the Y direction have their spins oriented in opposite directions and that the columns adjacent to each other in the X direction have their spins oriented in the same direction.

Figure 3:
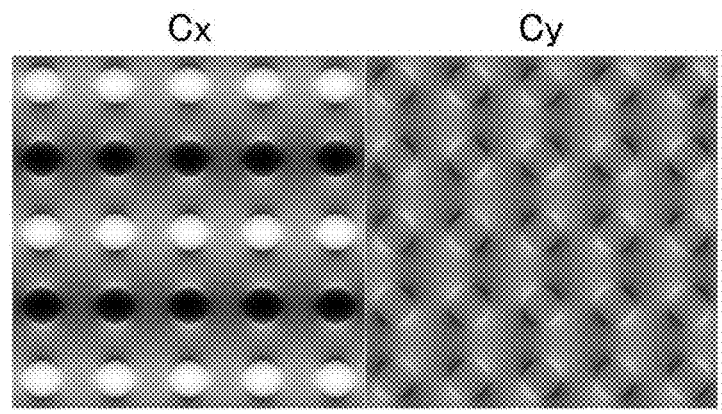
FIG. 3 illustrates only magnetic field induced contrast in the phase images Dx and Dy.

In FIG. 3, there are shown an image Cx representative of only magnetic field induced contrast in the phase image Dx and another image Cy representative of only magnetic field induced contrast in the phase image Dy.

In the phase image Dx shown in FIG. 2, the magnetic field induced contrast shown in the image Cx of FIG. 3 is superimposed on the electric field induced contrast. However, in the phase image Dx of FIG. 2, no magnetic field induced contrast is seen. Similarly, in the phase image Dy, the magnetic field induced contrast shown in the image Cy of FIG. 3 is superimposed on the electric field induced contrast. In the phase image Dy of FIG. 2, no magnetic field induced contrast is seen for the following reason. In an atomic resolution image, the effects of electric fields produced by atomic nuclei are generally very strong, while the effects of magnetic fields generated by spins are small.

(2) Analysis of Period of Electric Fields (S20)

Then, the period of electric fields is found. For this purpose, a lattice vector is found as the period of electric fields. The lattice vector can be found, for example, from the positions of spots when an ADF image $I_{ADF}$ is Fourier transformed. Furthermore, a lattice vector may be found from an ADF image $I_{ADF}$ using software that performs geometric phase analysis (GPA).

In order to find lattice vectors, it is desirable to use the ADF image $I_{ADF}$ which is less sensitive to electric and magnetic fields and which precisely reflects the positions of atoms. In the phase images Dx and Dy and the ADF image $I_{ADF}$ shown in FIG. 2, there are shown lattice vectors A and B which are perpendicular to each other. The image used to find lattice vectors is not restricted to the ADF image $I_{ADF}$ but may be a phase image. Furthermore, it may be a bright field STEM image.

(3) Separation of Electromagnetic Field (S30) and Generation of Image (S40)

Then, in the phase images Dx and Dy, each of the electromagnetic fields in the columns is separated into magnetic field and electric field components.

In the present step, it is assumed that an arbitrary one (such as a first one) of the columns in the phase images Dx and Dy is a subject of observation. The electromagnetic field in the first column is separated into magnetic field and electric field components based on a second one of the columns having an electromagnetic field whose magnetic field component is oriented opposite to that of the electromagnetic field in the first column and whose electric field component is oriented in the same direction as that of the electromagnetic field in the first column.

As described previously, the phase images Dx and Dy contain columns which are adjacent to each other in the Y direction. The magnetic fields in these adjacent columns are oriented oppositely to each other but the electric fields in the adjacent columns are oriented in the same direction. Therefore, assuming that the electric field in the first column is identical in strength to the electric field in the second column, the difference between the electromagnetic field in the first column and the electromagnetic field in the second column is computed. Consequently, the electric field component in the first column and the electric field component in the second column cancel out, so that the difference between the magnetic field components in the first and second columns remains. Especially, where the magnetic fields of spins are oriented oppositely, the magnetic field component in the first column can be extracted. Furthermore, by calculating the sum of the electromagnetic fields respectively in the first and second columns, the magnetic field components respectively in the first and second columns cancel out, whereby the electric field component in the first column can be extracted.

Figure 4:
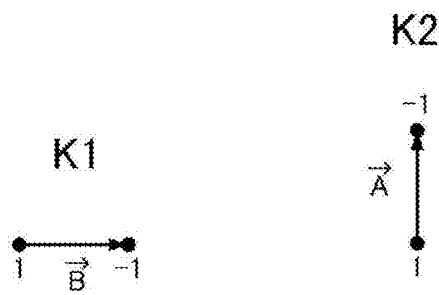
FIG. 4 illustrates kernels K1 and K2.

In this example, the magnetic field components of the electromagnetic fields in the columns are extracted by convolving the phase images Dx and Dy with the kernel K2 shown in FIG. 4, the kernel being used to compute the difference between the electromagnetic fields in the columns adjacent to each other in the Y direction.

FIG. 4 illustrates the kernels K1 and K2. The kernel K1 is used to find the difference between the electromagnetic fields respectively in columns adjacent to each other in the X direction. The kernel K2 is used to find the difference between the electromagnetic fields respectively in columns adjacent to each other in the Y direction.

With respect to the kernels K1 and K2, it is assumed that the sum of the values (each may be positive or negative) at all the points is null and that the interval between any adjacent points is an integral multiple of a lattice vector. In this example, the integral multiple is unity (1).

Figure 5:
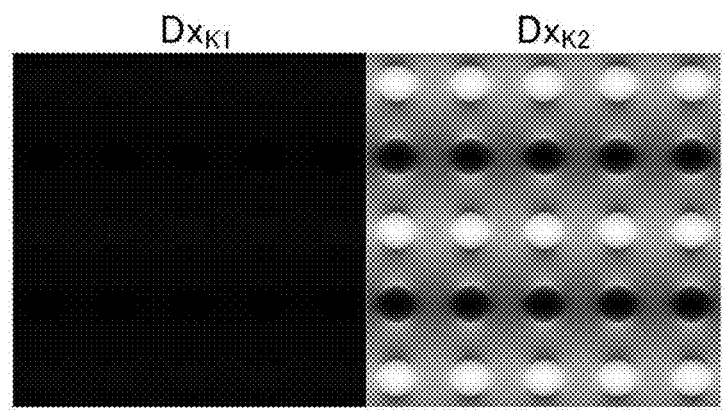
FIG. 5 illustrates the results of convolution operations on the phase image Dx.

FIG. 5 shows the results of convolution operations on the phase image Dx. In FIG. 5, an image $Dx_{K1}$ shows the result of a convolution of the phase image Dx with the kernel K1. Another image $Dx_{K2}$ shows the result of a convolution of the phase image Dx with the kernel K2.

As described previously, a ferromagnetic substance has columns which are adjacent to each other in the Y direction. Atomic nuclei in the adjacent columns produce electric fields oriented in the same direction but nuclear spins in the adjacent columns produce magnetic fields oriented in opposite directions. Convolving a first one of the columns in the phase image Dx with the kernel K2 results in the difference with the electromagnetic field in a second column adjacent to the first column in the Y direction. The electromagnetic field in the second column has a magnetic field component oriented opposite to that of the electromagnetic field in the first column and an electric field component oriented in the same direction as that of the electromagnetic field in the first column. Therefore, convolving the first column with the kernel K2 cancels out the electric field components in the first and second columns. Only the magnetic field components are left. Consequently, the magnetic field component can be extracted from the electromagnetic field in the first column.

In this way, by convolving the phase image Dx with the kernel K2, the electric field components in the columns are canceled out. As a result, there is obtained the image $Dx_{K2}$ in which only the magnetic field components in the columns are left. That is, the image $Dx_{K2}$ represents a distribution of the magnetic fields in the columns.

It is seen from the image $Dx_{K2}$ that the magnetic fields respectively in the columns adjacent to each other in the Y direction have components oriented in mutually opposite directions. A ferromagnetic substance has columns adjacent to each other in the X direction, and electric fields induced in their respective ones of the columns by atomic nuclei are oriented in the same direction. Also, magnetic fields induced by nuclear spins in the columns are oriented in the same direction. Therefore, by convolving the phase image Dx with the kernel K1, the electric and magnetic fields in the columns cancel out. As a result, a wholly black (i.e., zero intensity) image $Dx_{K1}$ is obtained.

In the foregoing example, the magnetic field components in the columns are extracted by finding the difference between the electromagnetic fields in columns adjacent to each other in the Y direction by making use of the fact that electric fields induced in the adjacent columns by atomic nuclei are oriented in the same direction and that magnetic fields induced in the adjacent columns by nuclear spins are oriented in opposite directions. In contrast, by finding the sum of the electromagnetic fields produced in columns adjacent to each other in the Y direction, the magnetic field components in the adjacent columns are canceled out, whereby the electric field components can be extracted. Consequently, an image representing a distribution of electric fields can be created.

Because of the process steps described so far, the electromagnetic fields in the columns within the phase image can be separated into magnetic field and electric field components. An image representative of a distribution of magnetic fields and an image representative of a distribution of electric fields can be generated.

1.2. Modified Embodiments

In the foregoing example, the magnetic field component in the first column being a subject of observation is extracted by computing the difference between the electromagnetic fields respectively in the first and second columns. The technique of extracting the magnetic field component in the first column is not restricted to this method.

For example, the magnetic field component in the first column can be extracted by estimating the electric field in the first column from a plurality of electromagnetic fields in plural columns in the vicinity of the first column. As an example, the electric field in the first column can be estimated based on all of the electromagnetic field in the column adjacent to the first column in the +Y direction, the electromagnetic field in the column adjacent to the first column in the −Y direction, the electromagnetic field in the column adjacent to the first column in the +X direction, and the electromagnetic field in the column adjacent to the first column in the −X direction.

The columns adjacent to the first column respectively in the +Y and −Y directions are hereinafter referred to as the second columns. In the second columns, electric nuclei produce electric fields oriented identically to those produced by atomic nuclei in the first column and also produce magnetic fields oriented oppositely to those produced by electron spins in the first column. The columns adjacent to the first column in the +X and −X directions are herein referred to as the third columns. In the third columns, electric fields induced by atomic nuclei are oriented in the same direction as those induced in the first column by atomic nuclei and magnetic fields induced by electron spins are oriented in the same direction as those in the first column. Therefore, by computing an average for the two second columns (in which electric fields are oriented in the same direction and magnetic fields are oriented opposite to each other) and the two third columns (in which electric fields are oriented in the same direction and magnetic fields are oriented in the same direction), the magnetic field components are canceled out. An average of the electric field components can be found. The average of the electric fields in these four columns is estimated as the electric field in the first column.

Figure 6:
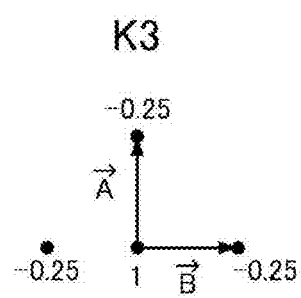
FIG. 6 illustrates a kernel K3.

The magnetic field components can be extracted from the electromagnetic fields in the columns by convolving the phase images Dx and Dy with the kernel K3 of FIG. 6 for calculating the differences from the averages of the electromagnetic fields in columns adjacent to each other respectively in the X and Y directions.

FIG. 6 illustrates the kernel K3 which is used to compute the differences from the averages of the electromagnetic fields in the columns adjacent to each other in the X and Y directions, respectively. The electric field components in the columns are canceled out by convolving the phase image Dx with the kernel K3. As a result, an image similar to the image $Dx_{K2}$ shown in FIG. 5 is derived. That is, by convolving the phase image Dx with the kernel K3, an image representing a magnetic field distribution is obtained.

In the phase image Dx shown in FIG. 2, it is assumed that electric field induced contrast has complete periodicity. However, depending on nonuniformity of the thickness of the sample, electric field induced contrast may have aperiodicity. In this case, if the kernel K2 is used, it is impossible to fully cancel out the electric field components in the columns due to the effects of the aperiodicity of the electric field induced contrast.

In contrast, when the kernel K3 is used, variations in the contrast are averaged because the kernel K3 is made up of a greater number of dots or pixels than the kernel K2. This can reduce the effects of aperiodicity of the electric field induced contrast as compared with the case where the kernel K2 is used. Accordingly, use of the kernel K3 makes it possible to decrease the electric field induced contrast as compared with the case where the kernel K2 is used.

Figure 7:
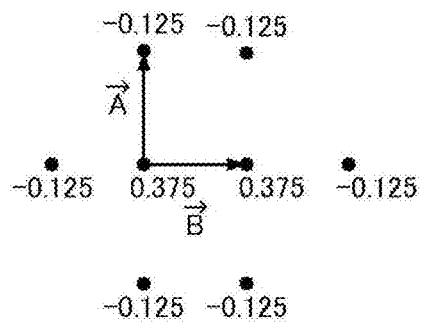
FIG. 7 illustrates a kernel K4.

FIG. 7 illustrates a kernel K4. This kernel K4 is made up of a larger number of pixels than the kernel K3. Therefore, use of the kernel K4 makes it possible to decrease electric field induced contrast than where the kernel K3 is used.

2. Image Processor

Figure 8:
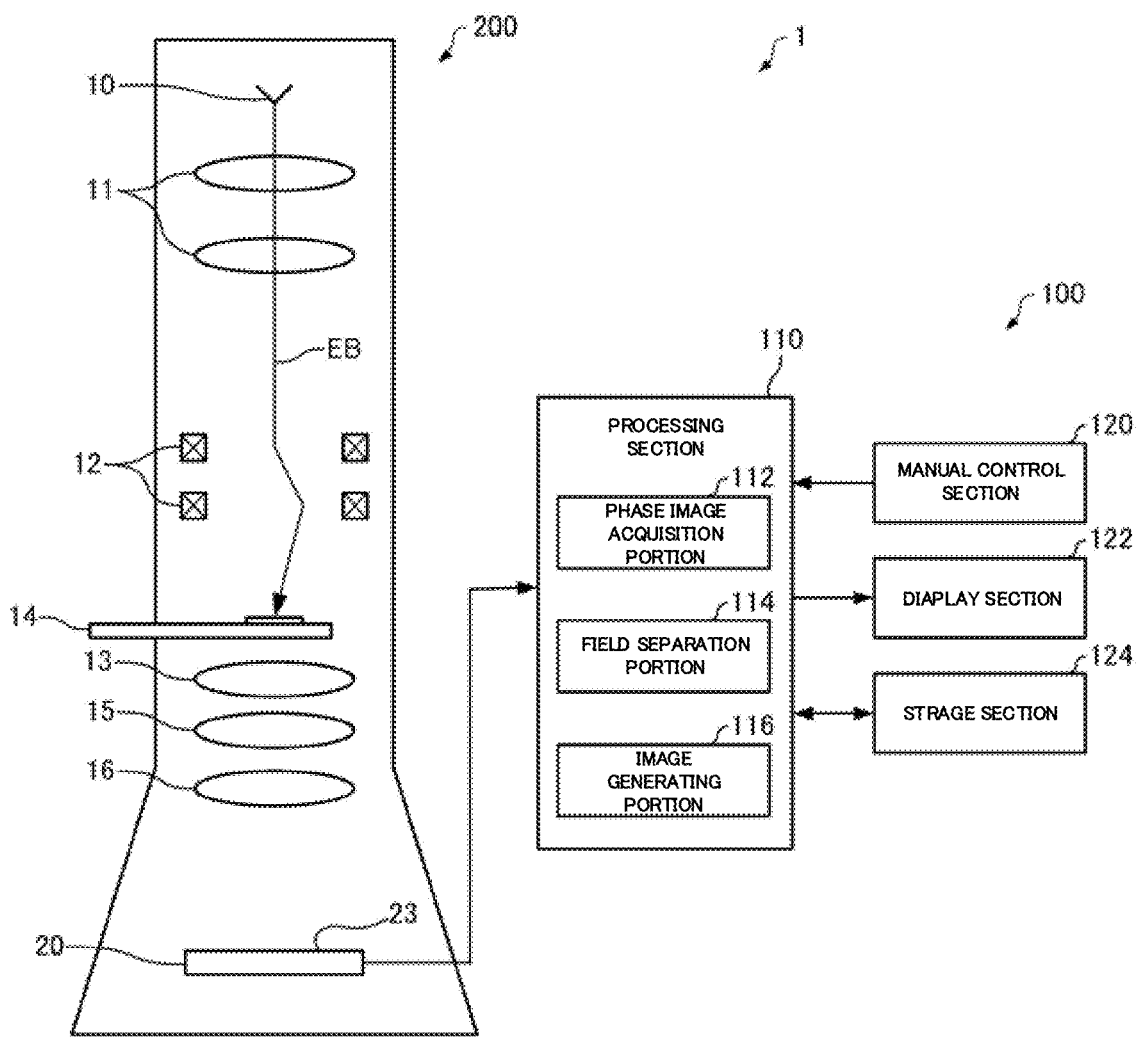
FIG. 8 is a diagram of a scanning transmission electron microscope, partially in block form, illustrating its configuration.

FIG. 8 shows the configuration of a scanning transmission electron microscope, generally indicated by numeral 1. This microscope 1 includes a main body portion 200 and an image processor 100. The main body portion 200 of the microscope can capture and generate phase images (DPC images). The image processor 100 can generate an image representative of a magnetic field distribution and an image representative of an electric field distribution using the method of image processing associated with the present embodiment from the phase images (DPC images) captured by the microscope main body portion 200.

As shown in FIG. 8, the main body portion 200 of the electron microscope includes an electron source 10, an illumination lens system 11, a scanning deflector 12, an objective lens 13, a sample stage 14, an intermediate lens 15, a projector lens 16, and a segmented detector 20.

For example, the electron source 10 is an electron gun for producing an electron beam EB which is converged by the illumination lens system 11. The scanning deflector 12 deflects the electron beam EB emitted from the electron source 10. Consequently, the electron beam EB can be scanned over a sample.

The electron beam EB is focused onto the sample by the objective lens 13. The objective lens 13 also operates to image electrons transmitted through the sample. The sample stage 14 mechanically holds the sample and can move the sample horizontally or vertically or tilt it.

The intermediate lens 15 and projector lens 16 together operate to project and focus the image formed by the objective lens 13 onto the detection surface 23 of the segmented detector 20.

The segmented detector 20 is mounted behind (i.e., downstream with regard to the electron beam EB) the projector lens 16. The detector 20 detects electrons transmitted through the sample.

Figure 9:
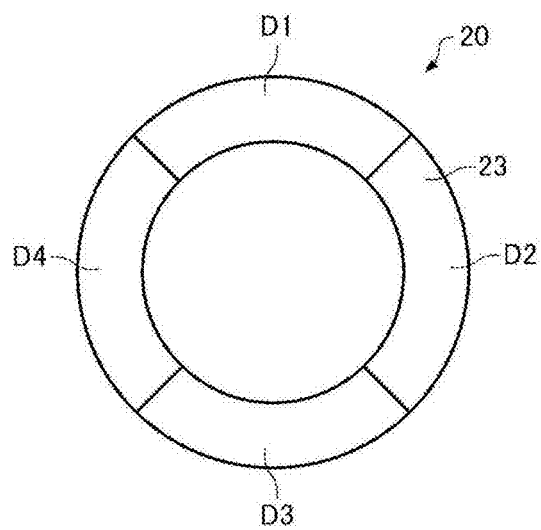
FIG. 9 is a schematic view of the detection surface of a segmented detector.

FIG. 9 schematically shows the detection surface 23 of the segmented detector 20. As shown, the detection surface 23 is split into four detection elements D1, D2, D3, and D4 each of which can independently detect electrons. The deflection of the electron beam EB caused by the electromagnetic field in the sample can be found from the amounts of signals produced from the four detection elements D1-D4, respectively. For example, a distribution of the X component of the electromagnetic field within the sample can be obtained from the differential image (differential phase contrast (DPC) image) between STEM images respectively derived from the detection elements D2 and D4. A distribution of the Y component of the electromagnetic field within the sample can be obtained from the differential image (differential phase contrast (DPC) image) between STEM images respectively derived from the detection elements D1 and D3. In this way, the microscope main body portion 200 can capture and produce DPC images using the segmented detector 20.

The image processor 100 includes a processing section 110, a manual control section 120, a display section 122, and a storage section 124. The manual control section 120 produces a control signal responsive to a user's manipulation and sends it to the processing section 110. The function of the manual control section 120 can be implemented, for example, by buttons, keys, a touch panel display, a microphone, or the like.

The display section 122 displays images generated by the processing section 110. The function of the display section 122 can be realized by an LCD, a CRT, or the like.

The storage section 124 stores programs, data, and related information enabling the processing section 110 to perform various kinds of computational processing. The storage section 124 functions also as a working area for the processing section 110. The function of the storage section 124 can be realized by a hard disk or a RAM (random access memory).

The processing section 110 performs processing to generate an image representative of a distribution of magnetic fields and an image representative of a distribution of electric fields from differential phase images obtained from the electron microscope main body portion 200 by the use of the image processing method associated with the present embodiment. The functions of the processing section 110 can be implemented by executing computer programs using a hardware device such as any one of various processors (e.g., CPU or DSP). The processing section 110 includes a phase image acquisition portion 112, a field separation portion 114, and an image generating portion 116.

The phase image acquisition portion 112 acquires phase images Dx and Dy from the electron microscope main body portion 200, the phase images Dx and Dy being captured and generated by the microscope main body portion 200.

For each of the acquired phase images Dx and Dy, the field separation portion 114 separates each of the electromagnetic fields in the columns into magnetic field and electric field components. The field separation portion 114 extracts the magnetic field components by convolving the phase image Dx, for example, with a kernel such as K2, K3, or K4.

The image generating portion 116 generates an image representative of a distribution of magnetic fields based on the extracted magnetic field components and displays the image on the display section 122.

The field separation portion 114 extracts electric field components from the electromagnetic fields in the columns within the acquired phase images Dx and Dy. The image generating portion 116 generates an image representative of a distribution of electric fields based on the extracted electric field components.

3. Functions and Advantageous Effects

The image processing method associated with the present embodiment involves the step of separating each of electromagnetic fields respectively present in columns into magnetic field and electric field components. This separating step includes the step of separating the electromagnetic field in a first one of the plural columns into magnetic field and electric field components based on the electromagnetic field in a second one of the columns having a magnetic field component oriented oppositely to that of the electromagnetic field in the first column and an electric field component oriented in the same direction as that of the electromagnetic field in the first column.

Therefore, in the image processing method associated with the present embodiment, it is possible to separate each of the electromagnetic fields in the columns within phase images into magnetic field and electric field components by image processing. Consequently, in the image processing method associated with the present embodiment, it is possible to obtain an image representative of a magnetic field distribution at atomic level, high resolution.

For example, where the same portion of a sample is measured before and after an inversion of the sample and the electromagnetic field in the sample is separated into magnetic field and electric field components, it is difficult to measure the same portion of the sample without producing atomic level, mechanical deviations. Therefore, in the technique involving inversion of a sample, it is impossible to obtain an image representative of a magnetic field distribution at atomic level, high resolution. In contrast, in the image processing method associated with the present embodiment, each of the electromagnetic fields in the columns within phase images can be separated into magnetic field and electric field components by image processing and so an image representative of a magnetic field distribution can be derived at atomic level, high resolution.

In the image processing method associated with the present embodiment, the magnetic field component in the first column is extracted based on the difference between the electromagnetic fields present respectively in the first and second columns. In this way, with the image processing method associated with the present embodiment, it is easy to extract a magnetic field component from phase images.

The image processing method associated with the present embodiment involves the step of generating an image representative of an electric field distribution based on separated electric field components. The step of separating each of the electromagnetic fields in the columns into magnetic field and electric field components includes the step of extracting the electric field component in the first column based on the sum of the electromagnetic fields respectively present in the first and second columns. In this way, in the image processing method associated with the present embodiment, it is easy to extract electric field components from phase images.

The image processing method associated with the present embodiment involves the step of separating the electromagnetic field present in the first column into magnetic field and electric field components. This step is carried out based on electromagnetic fields present respectively in second and third columns. The magnetic field component in the second column is oriented oppositely to that in the first column. The electric field component in the second column is oriented in the same direction as that in the first column. The magnetic field component and the electric field component in the third column are oriented in the same directions as those in the first column. In this way, in the image processing method associated with the present embodiment, magnetic field components can be easily extracted from phase images. Furthermore, in a case where electric field induced contrast has aperiodicity, for example, due to nonuniformity of the thickness of the sample, the effects of the aperiodicity of the electric field induced contrast can be reduced because variations in the contrast are averaged. Consequently, the electric field induced contrast can be reduced further.

The image processor 100 includes the phase image acquisition portion 112 for obtaining phase images providing visualization of electromagnetic fields respectively present in a plurality of columns, the field separation portion 114 for separating each of the electromagnetic fields in the columns within the phase images into magnetic field and electric field components based on the separated magnetic field components; and the image generating portion 116 for creating an image representative of a magnetic field distribution. The image generating portion 116 separates the electromagnetic field in a first one of the plurality of columns into magnetic field and electric field components based on the electromagnetic field in a second one of the columns, the latter electromagnetic field having a magnetic field component oriented oppositely to that of the electromagnetic field in the first column and an electric field component oriented in the same direction as that of the electromagnetic field in the first column. Therefore, the image processor 100 can separate each of the electromagnetic fields in the columns within phase images into magnetic field and electric field components by image processing. In consequence, the image processor 100 can give rise to an image representative of a magnetic field distribution at atomic level, high resolution.

4. Specific Embodiments

Specific embodiments of the present invention are given below and the invention is described in further detail. It is to be understood that the invention is by no means limited by the following specific embodiments.

4.1. Domain Boundaries in Antiferromagnetic Substance

The image processing method associated with the present embodiment is applied to observation of domain boundaries in an antiferromagnetic substance. This application is described below.

Figure 10:
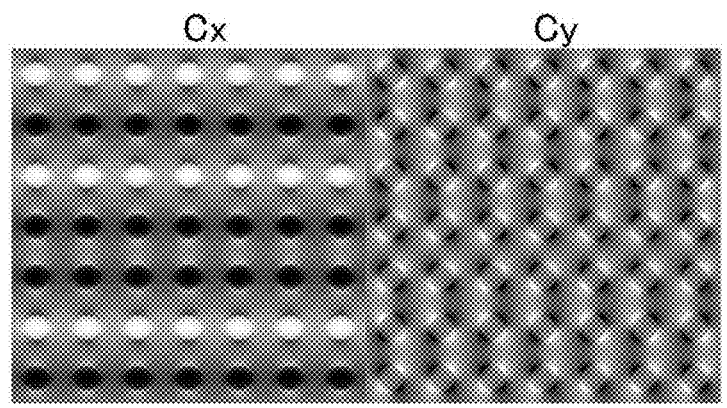
FIG. 10 illustrates only magnetic field induced contrast in phase images of domain boundaries.

FIG. 10 illustrates only magnetic field induced contrast in phase images of domain boundaries. FIG. 10 shows an image Cx indicating the amount of deflection in the X direction. FIG. 10 also shows an image Cy indicating the amount of deflection in the Y direction. In an actual phase image of domain boundaries, electric field induced contrast is added to the magnetic field contrast shown in FIG. 10. Therefore, it is difficult to directly observe the images Cx and Cy representative of a magnetic field distribution shown in FIG. 10.

The kernel K2 shown in FIG. 4 is applied to the images Cx and Cy shown in FIG. 10. That is, the images Cx and Cy are convolved with the kernel K2.

Figure 11:
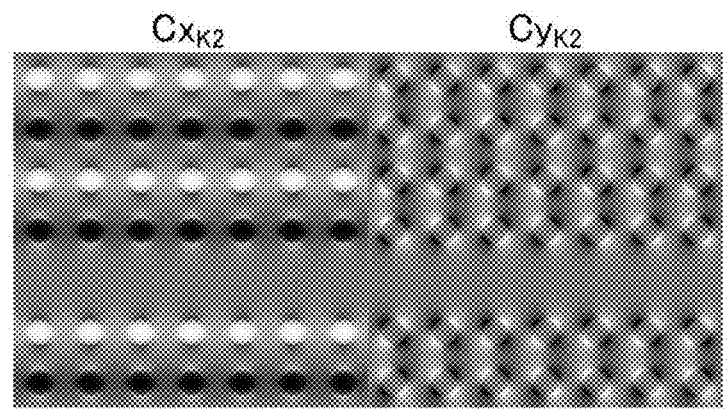
FIG. 11 shows an image $Cx_{K2}$ produced by applying the kernel K2 to an image Cx and an image $Cy_{K2}$ produced by applying the kernel K2 to an image Cy.

FIG. 11 shows an image $Cx_{K2}$ produced by convolving the image Cx with the kernel K2, as well as an image $Cy_{K2}$ produced by convolving the image Cy with the kernel K2.

Where the images Cx and Cy are convolved with the kernel K2, the contrast at the domain boundaries disappears locally along a line (hereinafter referred to as the first line) as shown in FIG. 11. This is different from the magnetic field distributions in the images Cx and Cy of FIG. 10 but it can be confirmed that the spin structure varies across this line of domain boundaries.

Figure 12:
FIG. 12 illustrates a kernel K5.

FIG. 12 illustrates the kernel K5 which is used to find the difference between the electromagnetic fields in columns adjacent to each other in the −Y direction. Note that the kernel K2 is used to find the difference in electromagnetic field between columns adjacent to each other in the +Y direction. The kernel K5 of FIG. 12 is applied to the images Cx and Cy shown in FIG. 10.

Figure 13:
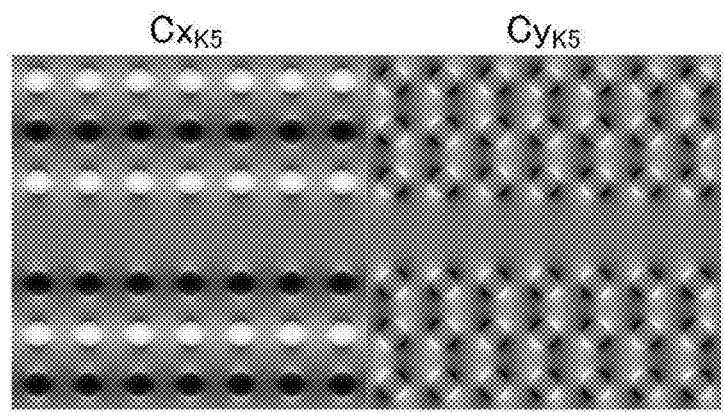
FIG. 13 shows an image $Cx_{K5}$ produced by applying the kernel K5 to the image Cx and an image $Cy_{K5}$ produced by applying the kernel K5 to the image Cy.

Referring to FIG. 13, application of the kernel K5 to the images Cx and Cy gives rise to images $Cx_{K5}$ and $Cy_{K5}$, respectively. As a result, the contrast at the domain boundaries disappears locally along a second line as shown in FIG. 13. The second line and the aforementioned first line are shifted in position with respect to one another.

Figure 14:
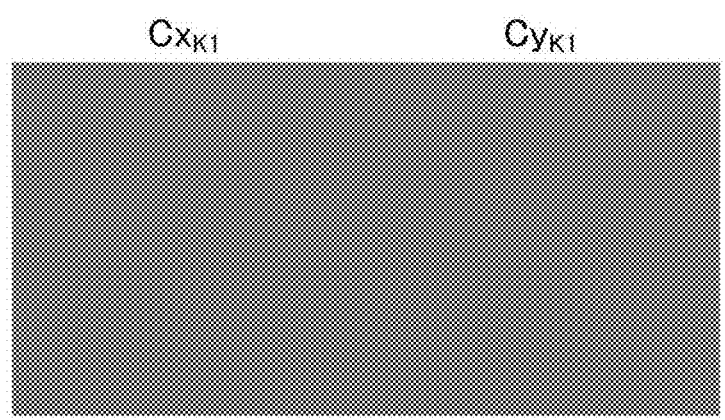
FIG. 14 shows an image $Cx_{K1}$ produced by applying the kernel K1 to the image Cx and an image $Cy_{K1}$ produced by applying the kernel K1 to the image Cy.

Then, the kernel K1 shown in FIG. 4 is applied to the images Cx and Cy shown in FIG. 10, resulting in images $Cx_{K1}$ and $Cy_{K1}$, respectively, as shown in FIG. 14. It is seen that the contrast is no longer present.

The presence and positions of domain boundaries can be estimated from the images $Cx_{K2}$, $Cy_{K2}$ of FIG. 11, the images $Cx_{K5}$, $Cy_{K5}$ of FIG. 13, and the images $Cx_{K1}$ and $Cy_{K1}$ of FIG. 14. In the foregoing example, a kernel is applied to the images Cx and Cy. A kernel may be applied with equal utility to actual phase images.

According to the image processing method associated with the present embodiment, information about a magnetic field distribution can be obtained from phase images of domain boundaries derived by a DPC technique. The presence and positions of the domain boundaries can be estimated.

4.2. Helimagnetic Material

In the following example, the image processing method associated with the present embodiment is applied to observation of a helimagnetic material.

Figure 15:
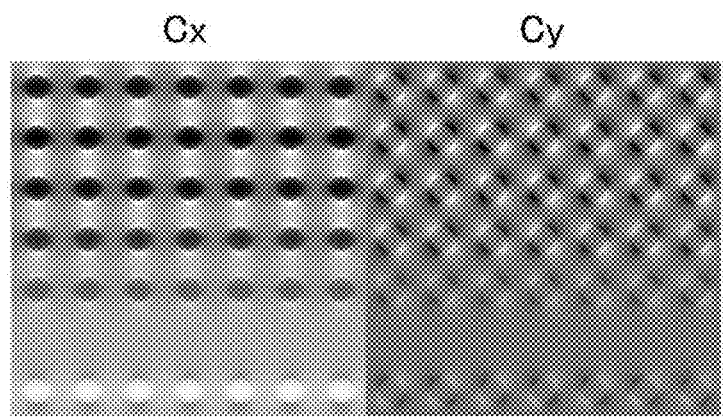
FIG. 15 illustrates only magnetic field induced contrast in phase images of a helimagnetic material.

FIG. 15 illustrates only magnetic field induced contrast in phase images of a helimagnetic material. FIG. 15 includes an image Cx representative of the amount of deflection in the X direction and an image Cy representative of the amount of deflection in the Y direction.

As shown in FIG. 15, in the helimagnetic material, electron spins are rotating such that their senses are dependent on position. In an actual DPC image of the helimagnetic material, electric field induced contrast is superimposed on magnetic field induced contrast of FIG. 15. Therefore, it is difficult to directly observe the images Cx and Cy of FIG. 15 which represent a magnetic field distribution. The kernel K2 shown in FIG. 4 is applied to the images Cx and Cy shown in FIG. 15. That is, the images Cx and Cy are convolved with the kernel K2.

Figure 16:
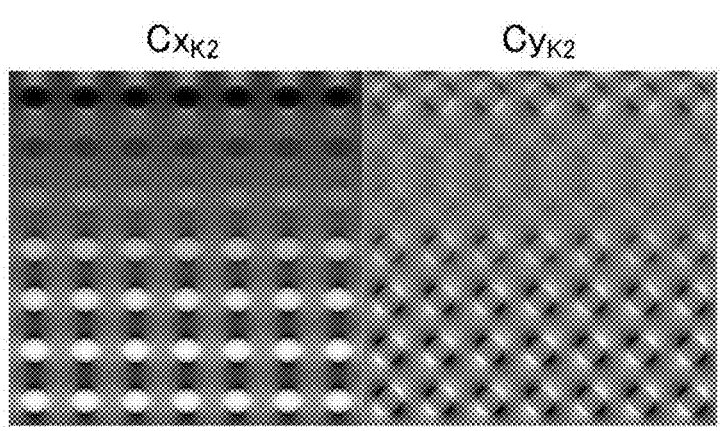
FIG. 16 shows an image $Cx_{K2}$ produced by applying the kernel K2 to the image Cx and an image $Cy_{K2}$ produced by applying the kernel K2 to the image Cy.

Referring to FIG. 16, application of the kernel K2 to the images Cx and Cy shown in FIG. 15 results in images $Cx_{K2}$ and $Cy_{K2}$, respectively. The images $Cx_{K2}$ and $Cy_{K2}$ shown in FIG. 16 is different from the magnetic field distribution itself represented by the images Cx and Cy but reflects the magnetic field distribution. Hence, information about the magnetic field distribution can be obtained. The magnetic field distribution in the helimagnetic material can be estimated more accurately by applying plural kernels and utilizing the results as in the foregoing example of the domain boundaries.

In this way, the image processing method associated with the present embodiment is applicable in the case where an image representative of a magnetic field distribution in the electromagnetic field in a first column is obtained based on an electromagnetic field in a second column having an electromagnetic field whose magnetic field component oriented oppositely to that of the electromagnetic field in the first column and whose electric field component oriented in the same direction as that of the electromagnetic field in the first column. The method is also applicable in the case where images representative of a magnetic field distribution in the first column are obtained based on the electromagnetic field in a second column, the latter electromagnetic field having a magnetic field component oriented in a direction different from that of the electromagnetic field in the first column and an electric field component oriented in the same direction as that of the electromagnetic field in the first column as in the example of a helimagnetic material.

The present invention is not restricted to the foregoing embodiments but rather can be implemented in various modified forms. For example, the present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. An image processing method comprising the steps of:
  acquiring phase images providing visualization of electromagnetic fields respectively present in a plurality of columns;
  separating each of the electromagnetic fields in the columns within the phase images into magnetic field and electric field components; and
  generating an image representative of a magnetic field distribution based on the separated magnetic field components;
  wherein the step of separating each of the electromagnetic fields in the columns includes the step of separating the electromagnetic field in a first one of the plurality of columns into magnetic field and electric field components based on the electromagnetic field in a second one of the columns, the electromagnetic field in the second column having an electric field component oriented in the same direction as the electric field component of the electromagnetic field in the first column.

2. An image processing method as set forth in claim 1, wherein said phase images are produced by providing visualization of phase variations that an electron beam undergoes from an electromagnetic field within a sample.

3. An image processing method as set forth in claim 1, wherein in said step of separating the electromagnetic field in said first column into magnetic field and electric field components, the magnetic field component of the electromagnetic field in said first column is extracted based on a difference between the electromagnetic field in the first column and the electromagnetic field in said second column.

4. An image processing method as set forth in claim 1, further comprising the step of generating an image representative of an electric field distribution based on the separated electric field components, and wherein the step of separating each of the electromagnetic fields in the columns into magnetic field and electric field components includes the step of extracting the electric field component of the electromagnetic field in said first column based on a sum of the electromagnetic fields respectively present in the first and second columns.

5. An image processing method as set forth in claim 1, wherein the magnetic field component of the electromagnetic field in said second column is oriented differently from the magnetic field component of the electromagnetic field in said first column.

6. An image processing method as set forth in claim 5, wherein the magnetic field component of the electromagnetic field in said second column is oriented oppositely to the magnetic field component of the electromagnetic field in said first column.

7. An image processing method as set forth in claim 1, wherein said step of separating the electromagnetic field in said first column into magnetic field and electric field components is carried out based on electromagnetic fields respectively present in said second column and a third one of said plurality of columns,
  wherein the electromagnetic field in said second column has a magnetic field component oriented oppositely to that of the electromagnetic field in the first column and an electric field component oriented in the same direction as that of the electromagnetic field in the first column, and
  wherein the electromagnetic field in said third column has a magnetic field component oriented in the same direction as that of the electromagnetic field in the first column and an electric field component oriented in the same direction as that of the electromagnetic field in the first column.

8. An image processing method as set forth in claim 1, wherein said phase images are representative of an antiferromagnetic substance.

9. An image processing method as set forth in claim 8, wherein said second column is adjacent to said first column, and wherein electron spins in the second column are oriented oppositely to electron spins in the first column.

10. An image processor comprising:
  a phase image acquisition portion for acquiring phase images providing visualization of electromagnetic fields respectively in a plurality of columns;
  a field separating portion for separating each of the electromagnetic fields in the columns within the phase images into magnetic field and electric field components; and
  an image generating portion for generating an image representative of a magnetic field distribution based on the separated magnetic field components;
  wherein the image generating portion separates the electromagnetic field in a first one of the plurality of columns into magnetic field and electric field components based on the electromagnetic field in a second one of the plurality of columns, the electromagnetic field in the second column having an electric field component oriented in the same direction as the electric field component of the electromagnetic field in the first column.

* * * * *